(12) United States Patent
Lee et al.

(10) Patent No.: US 8,609,519 B2
(45) Date of Patent: Dec. 17, 2013

(54) COMBINATORIAL APPROACH FOR SCREENING OF ALD FILM STACKS

(75) Inventors: Albert Lee, Cupertino, CA (US); Tony P. Chiang, Campbell, CA (US); Jason Wright, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/302,730

(22) Filed: Nov. 22, 2011

(65) Prior Publication Data

US 2013/0130490 A1      May 23, 2013

(51) Int. Cl.
| | |
|---|---|
| *H01L 21/00* | (2006.01) |
| *H01L 21/31* | (2006.01) |
| *H01L 21/469* | (2006.01) |
| *H01L 21/20* | (2006.01) |
| *H01L 21/205* | (2006.01) |
| *H01L 21/365* | (2006.01) |

(52) U.S. Cl.
USPC ........... 438/485; 438/761; 438/771; 438/772; 438/776; 438/777; 257/E21.09; 257/E21.101; 257/E21.17; 257/E21.463; 257/E21.586

(58) Field of Classification Search
USPC .................................................. 438/579, 761
See application file for complete search history.

(56) References Cited

U.S. PATENT DOCUMENTS

| | | | |
|---|---|---|---|
| 2007/0068798 A1* | 3/2007 | Honda et al. ................... | 204/194 |
| 2009/0061083 A1* | 3/2009 | Chiang et al. .............. | 427/248.1 |

* cited by examiner

*Primary Examiner* — Calvin Choi (57) ABSTRACT

In some embodiments of the present invention, methods of using one or more small spot showerhead apparatus to deposit materials using CVD, PECVD, ALD, or PEALD on small spots in a site isolated, combinatorial manner are described. The small spot showerheads may be configured within a larger combinatorial showerhead to allow multi-layer film stacks to be deposited in a combinatorial manner.

18 Claims, 10 Drawing Sheets

COMBINATORIAL APPROACH FOR SCREENING OF ALD FILM STACKS

FIELD OF THE INVENTION

The present invention relates generally to methods for the deposition of materials on site isolated regions of a substrate in a combinatorial manner. The apparatus is operable to deposit materials using chemical vapor deposition (CVD) or atomic layer deposition (ALD) technologies. Additionally, the apparatus is compatible with the plasma enhanced versions of these technologies (i.e. PECVD and PEALD).

BACKGROUND OF THE INVENTION

The manufacture of semiconductor devices, TFPV modules, optoelectronic devices, etc. entails the integration and sequencing of many unit processing steps. As an example, device manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, the CVD and ALD adaptations of HPC techniques generally deposit materials on relatively large areas of the substrate. As an example, ALD deposition on a quarter of the substrate is common. However, it is desirable to deposit materials on a substrate using CVD or ALD in a site isolated manner wherein the size of the region is very small relative to the substrate. Therefore, there is a need to develop methods that enable the deposition of materials using CVD, PECVD, ALD, or PEALD on small spots in a site isolated, combinatorial manner to form multi-layer film stacks.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, one or more small spot showerhead apparatus are used to deposit materials using CVD, PECVD, ALD, or PEALD on small spots in a site isolated, combinatorial manner. The small spot showerheads may be configured within a larger combinatorial showerhead to allow multi-layer film stacks to be deposited in a combinatorial manner,

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
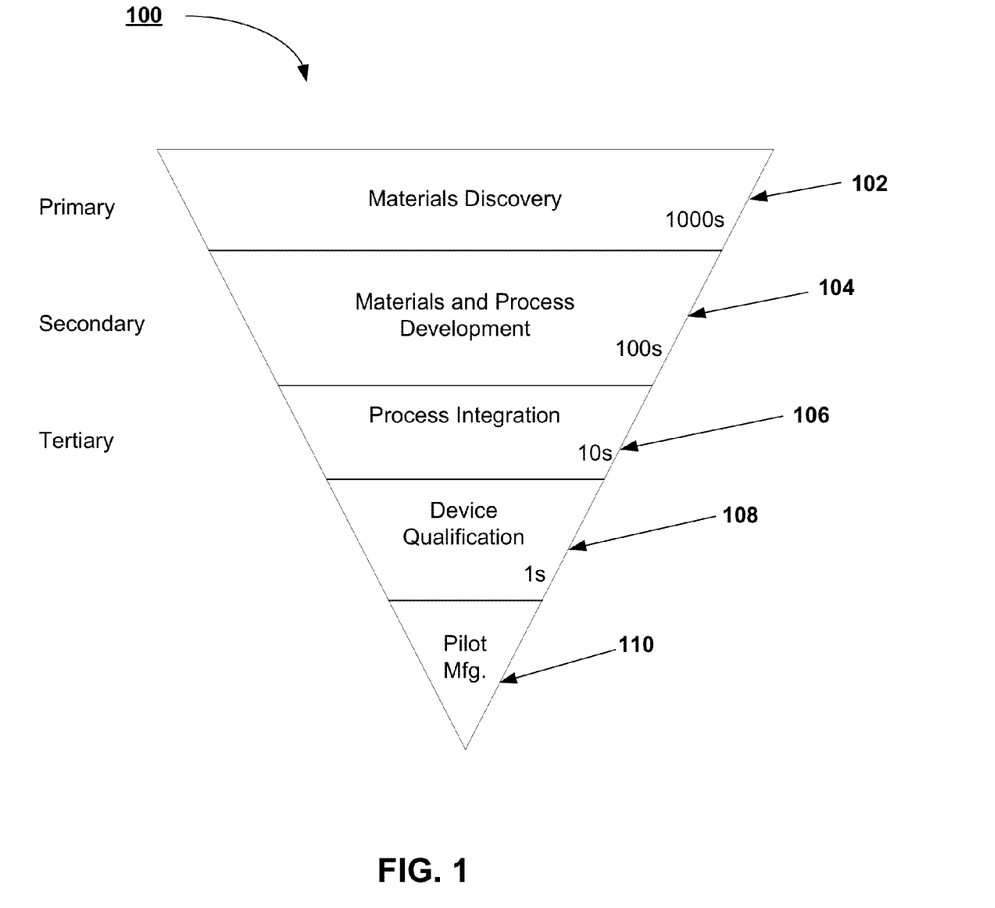
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor devices, TFPV modules, optoelectronic devices, etc. manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor devices, TFPV modules, optoelectronic devices, etc. device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture semiconductor devices, TFPV modules, optoelectronic devices, etc. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor devices, TFPV modules, optoelectronic devices, etc. For example, such structures may include, but would not be limited to, contact layers, buffer layers, absorber layers, or any other series of layers or unit processes that create an intermediate structure found on semiconductor devices, TFPV modules, optoelectronic devices, etc. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intraregion uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
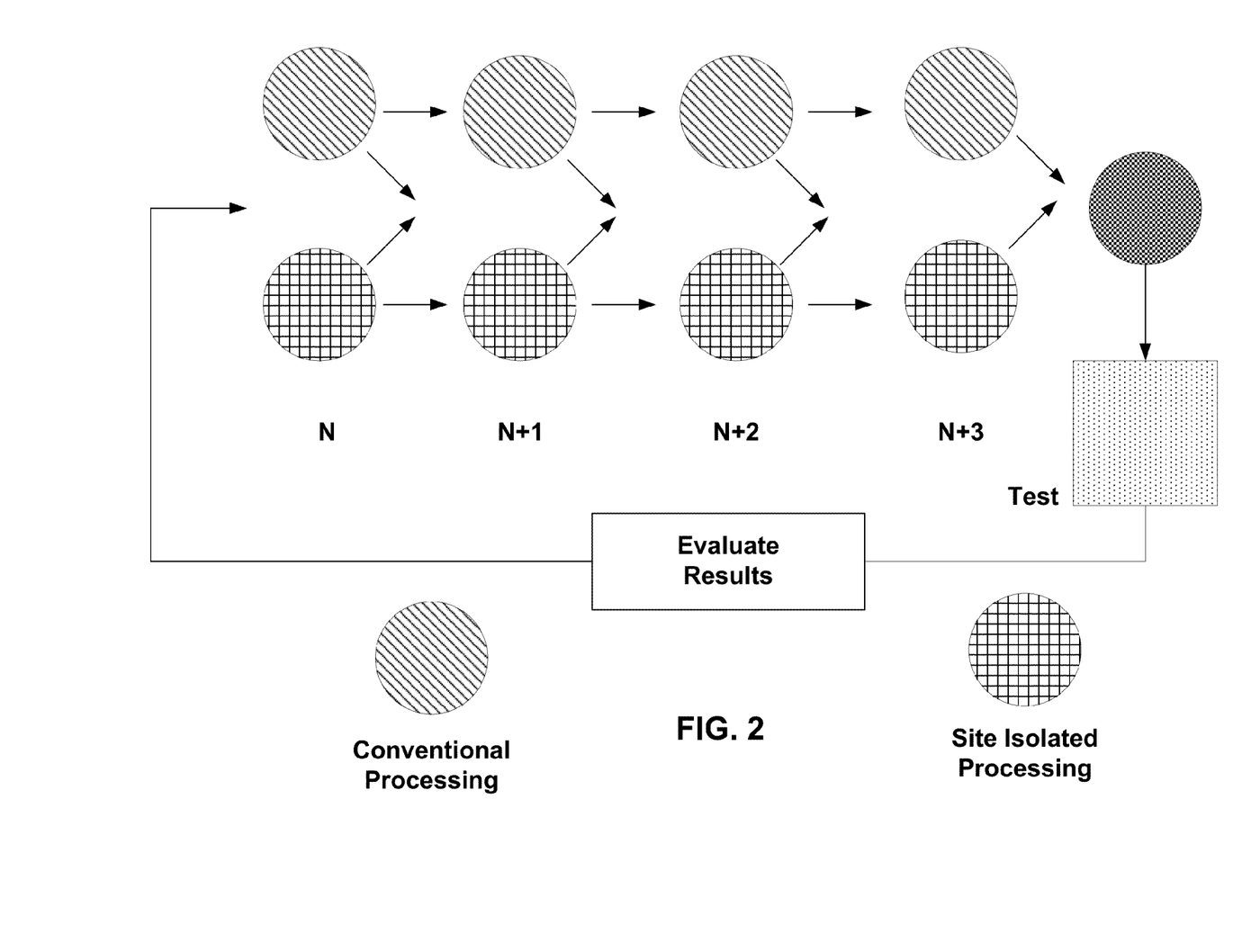
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor device, TFPV module, optoelectronic device, etc. manufacturing may be varied.

Figure 3:
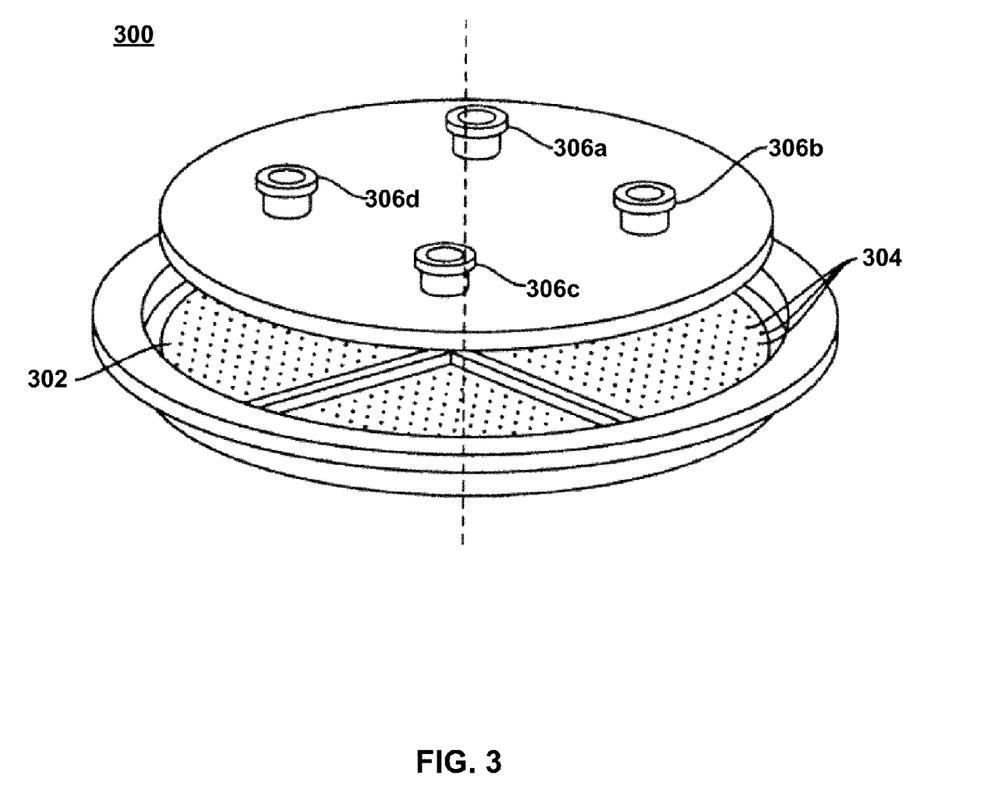
FIG. 3 illustrates an example of a large area ALD or CVD showerhead used for combinatorial processing.

FIG. 3 illustrates an example of a large area ALD or CVD showerhead, 300, used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2001, U.S. patent application Ser. No. 12/013,759 entitled "Vapor Based Combinatorial Processing" filed on Jan. 14, 2008 and claiming priority to Provisional Application No. 60/970,199 filed on Sep. 5, 2001, and U.S. patent application Ser. No. 12/205,578 entitled "Vapor Based Combinatorial Processing" filed on Sep. 5, 2008 which is a Continuation application of the U.S. patent application Ser. No. 12/013,729 and claiming priority to Provisional Application No. 60/970,199 filed on Sep. 5, 2001, all of which are herein incorporated by reference.

The large area ALD or CVD showerhead, 300, illustrated in FIG. 3 comprises four regions, 302, used to deposit materials on a substrate. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 306a-306b. For simplicity, the four regions, 302, of showerhead, 300, have been illustrated as being a single chamber. Those skilled in the art will understand that each region, 302, of showerhead, 300, may be designed to have two or more isolated gas distribution systems so that multiple reactive gases may be kept separated until they react at the substrate surface. Also for simplicity, on a single gas inlet conduit, 306a-306d, is illustrated for each of the four regions. Those skilled in the art will understand that each region, 302, of showerhead, 300, may have multiple gas inlet conduits. The gases exit each region, 302, of showerhead, 300, through holes, 304, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 3 is operable to be used with any of a CVD, PECVD, ALD, or PEALD technology.

Figure 4:
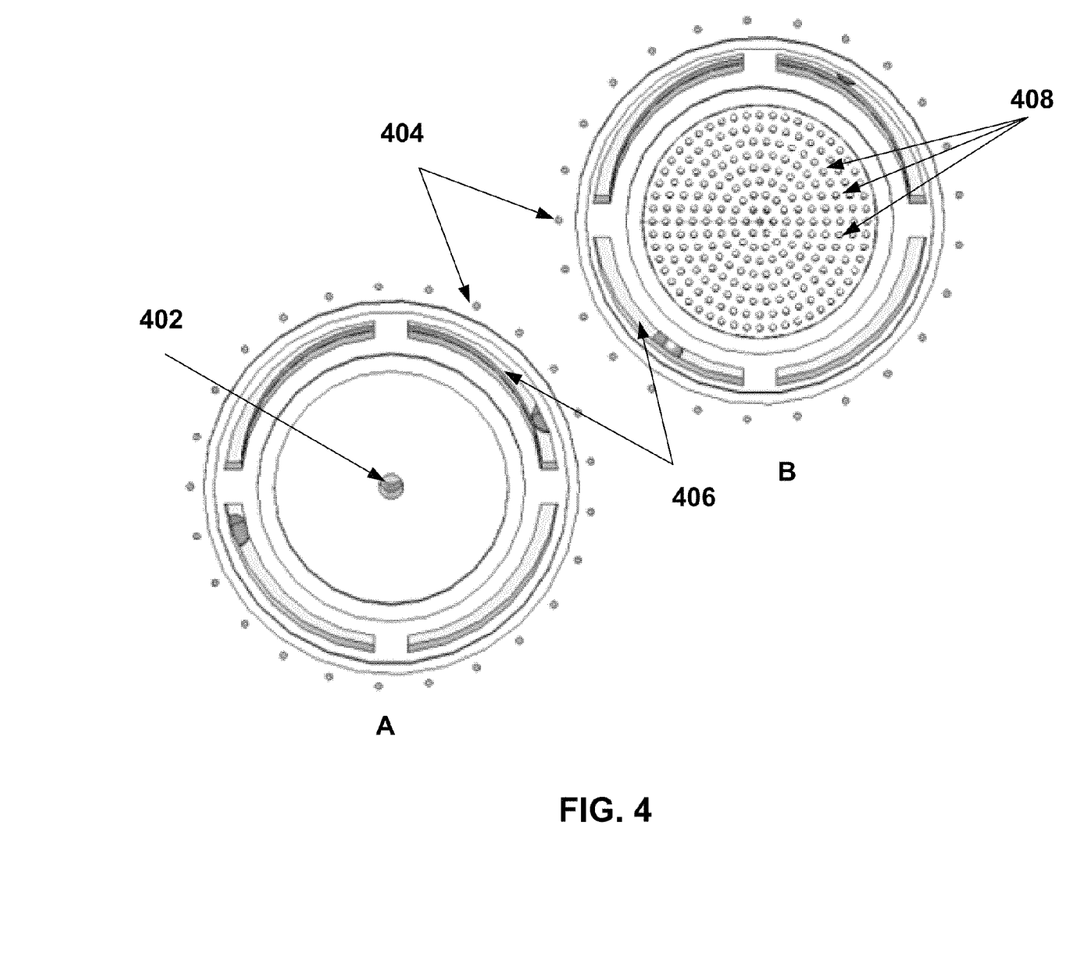
FIG. 4 illustrates a bottom view of two examples of a small spot showerhead apparatus in accordance with some embodiments of the present invention.

As discussed previously, showerhead, 300, in FIG. 3 results in a deposition (or other process type) on a relatively large region of the substrate. In this example, a quadrant of the substrate. To address the limitations of the combinatorial showerhead illustrated in FIG. 3, small spot showerheads have been designed as illustrated in FIG. 4. FIG. 4 illustrates a bottom view of two examples of a small spot showerhead apparatus in accordance with some embodiments of the present invention. The small spot showerhead configuration, A, illustrated in FIG. 4 comprises a single gas distribution port, 402, in the center of the showerhead for delivering reactive gases to the surface of the substrate. The small size of the small spot showerhead and the behavior of the technologies envisioned to use this showerhead ensure that the uniformity of the process on the substrate is adequate using the single gas distribution port. However, the small spot showerhead configuration, B, illustrated in FIG. 4 comprises a plurality of gas distribution ports, 408, for delivering reactive gases to the surface of the substrate. This configuration can be used to improve the uniformity of the process on the substrate if required.

Each small spot showerhead is surrounded by a plurality of purge holes, 404. The purge holes introduce inert purge gases (i.e. Ar, $N_2$, etc.) around the periphery of each small spot showerhead to insure that the regions under each showerhead can be processed in a site isolated manner. The gases, both the reactive gases and the purge gases, are exhausted from the process chamber through exhaust channels, 406, that surround each of the showerheads. The combination of the purge holes, 404, and the exhaust channels, 406, ensure that each region under each showerhead can be processed in a site isolated manner. The diameter of the small spot showerhead (i.e. the diameter of the purge ring) can vary between about 40 mm and about 100 mm. Advantageously, the diameter of the small spot showerhead is about 65 mm.

Figure 5:
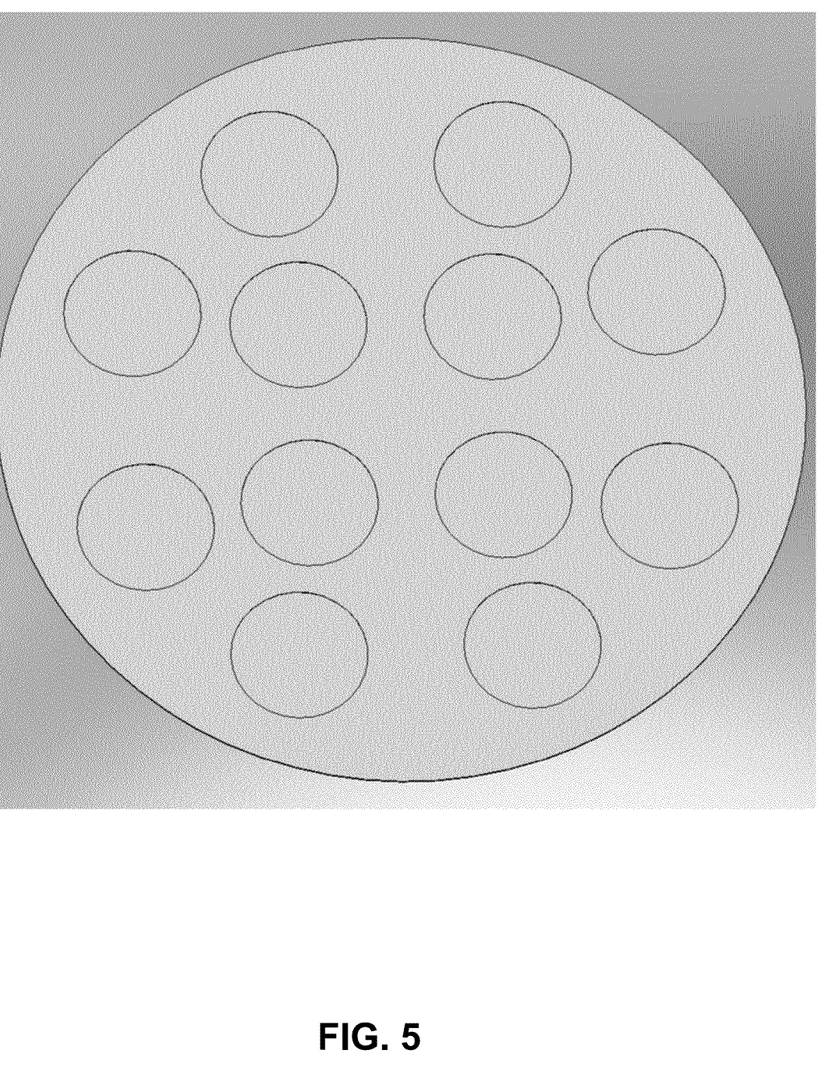
FIG. 5 illustrates one example of a pattern of site isolated regions that can be processed using a small spot showerhead apparatus in accordance with some embodiments of the present invention.

Using a plurality of small spot showerheads as illustrated in FIG. 4 allows a substrate to be processed in a combinatorial manner wherein different parameters can be varied as discussed above. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 5 illustrates one example of a pattern of site isolated regions that can be processed using a small spot showerhead apparatus in accordance with some embodiments of the present invention. In FIG. 5, the substrate is still generally divided into four quadrants and within each quadrant, three site isolated regions can be processed using small spot showerheads as illustrated in FIG. 4, yielding twelve site isolated regions on the substrate. Therefore, in this example, twelve independent experiments could be performed on a single substrate.

Figure 6:
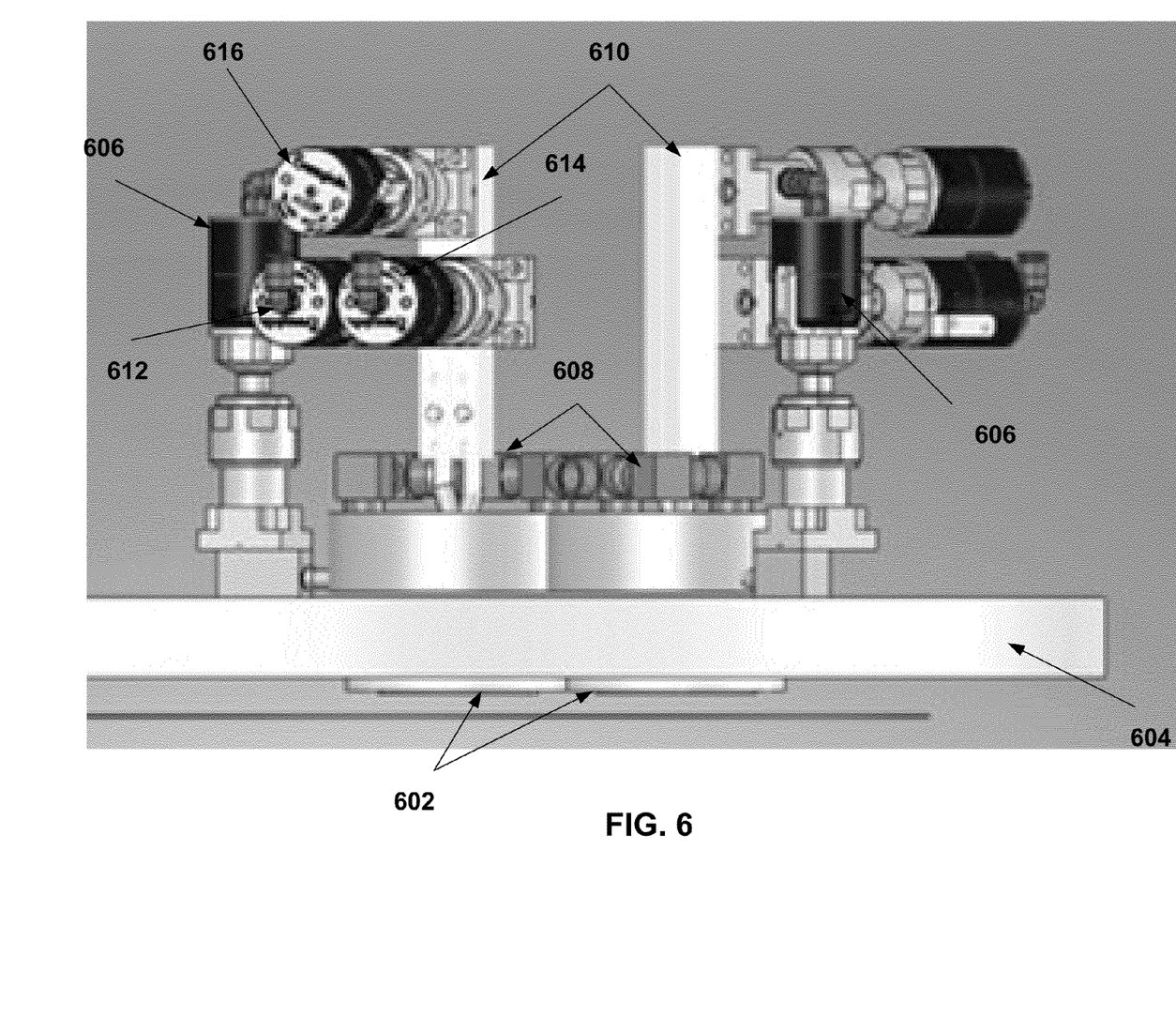
FIG. 6 illustrates a side view of two examples of a small spot showerhead apparatus in accordance with some embodiments of the present invention.

FIG. 6 illustrates a side view of two examples of a small spot showerhead apparatus in accordance with some embodiments of the present invention. For illustration purposes, two small spot showerhead assemblies are shown. As discussed previously, any number of spot showerhead assemblies may be used, limited only by practical constraints such as chamber size, small spot showerhead assembly size, substrate size, etc. In FIG. 6, two small spot showerheads, 602, are illustrated as being mounted on the bottom of a chamber lid, 604. The showerheads will be as described previously with respect to FIG. 4. Each small spot showerhead assembly will have an independent gas distribution system. Valves to control the introduction of the purge gas to the purge holes (404 in FIG. 4) are illustrated at 606. Each showerhead assembly will have independent purge capability. The conduits that deliver the gases to showerhead assemblies are not shown for simplicity. Each showerhead assembly will have an independent exhaust ring (406 in FIG. 4). The manifolds for the exhaust rings are illustrated at 608. The reactive gases are delivered to each showerhead assembly through a gas delivery manifold, 610. Each showerhead assembly will have an independent gas delivery manifold. The configuration illustrated in FIG. 6 delivers two reactive gases to each showerhead assembly. A first reactive gas is introduced through valve, 612. A second reactive gas is introduced through valve, 614. Additionally, each gas delivery manifold will have a purge capability wherein an inert gas is used to purge the manifold and is introduced through valve, 616. The details of the construction of the manifolds, the valves, and the gas delivery are well known in the art and will not be described herein in detail. Although two reactive gases are illustrated in FIG. 6, those skilled in the art will understand that any number of reactive gases may be supplied to gas delivery manifold, 610, for introduction into the process chamber.

Figure 7:
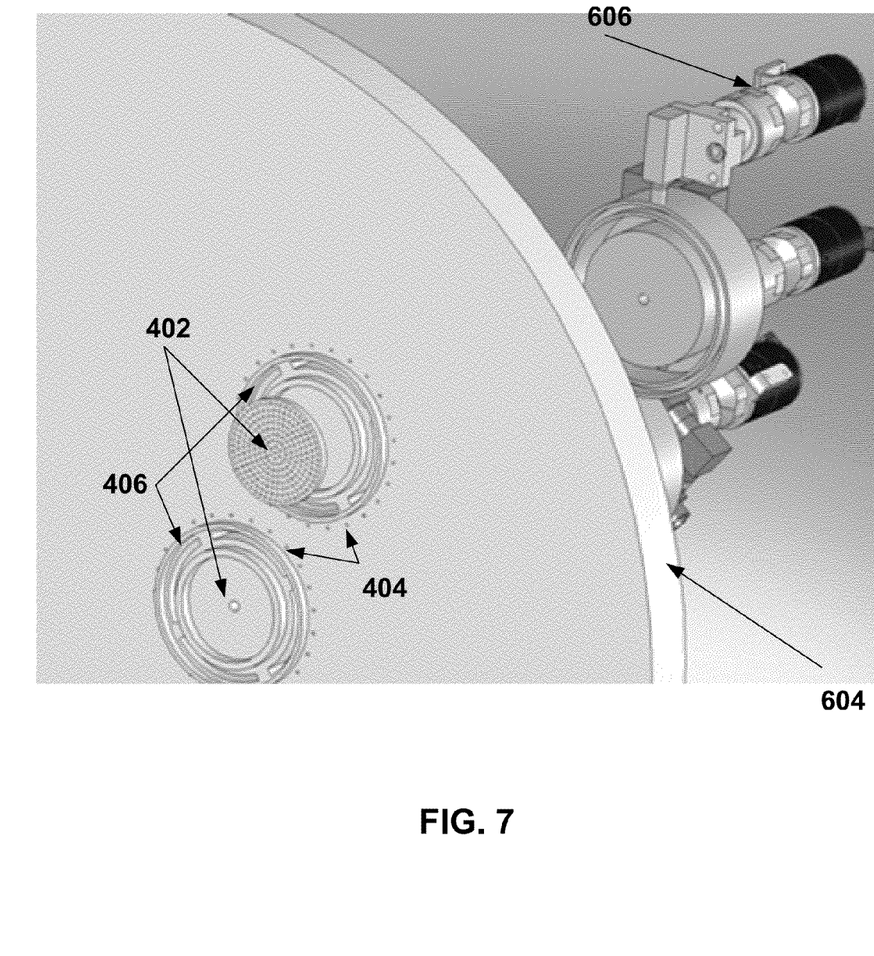
FIG. 7 illustrates a bottom view of two examples of a small spot showerhead apparatus in accordance with some embodiments of the present invention.

FIG. 7 illustrates a bottom view of two examples of a small spot showerhead apparatus in accordance with some embodiments of the present invention. FIG. 7 gives an additional perspective of the small spot showerheads mounted on or integrated into the chamber lid, 604 and their associated gas delivery systems. Illustrated in FIG. 7 are the gas distribution holes, 402, the purge holes, 404, and the exhaust channels, 406. Also illustrated is one of the valves for the purge holes, 606.

Although the chamber lid, 604, is illustrated as being solid in FIG. 7, in some embodiments of the present invention, the chamber lid comprises large area, combinatorial showerhead sections as discussed previously with respect to FIG. 3. In this configuration, large area (i.e. quadrant) processing can be combined with the small spot processing to allow multilayer films stacks to be screened in a combinatorial manner as discussed previously. Apparatus of combining large area (i.e. quadrant) processing with the small spot processing of the present invention are described in U.S. patent application Ser. No. 13/302,097 filed on Nov. 22, 2011 entitled "Combinatorial Deposition Based on a Spot Apparatus" and is herein incorporated by reference.

Figure 8:
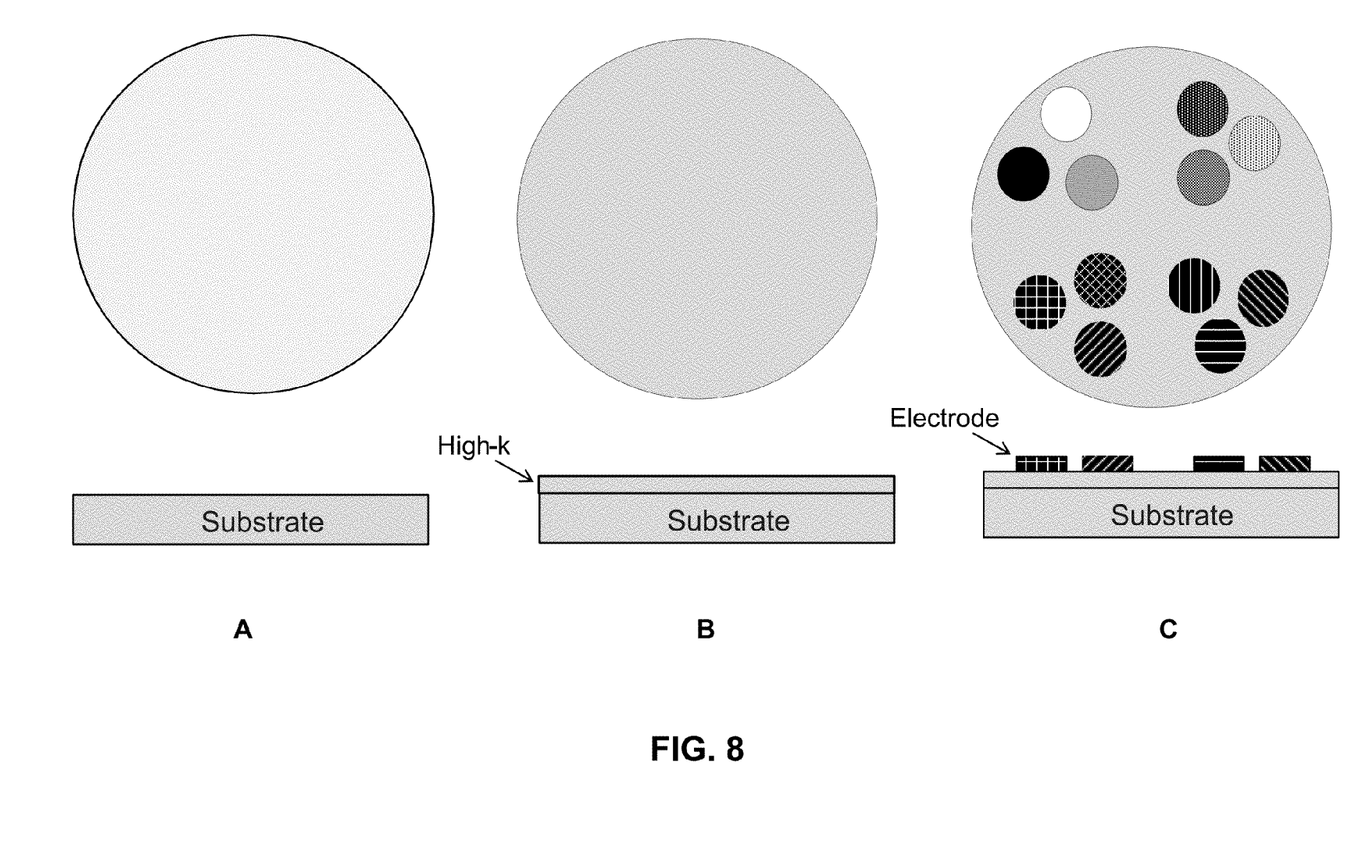
FIG. 8 illustrates an exemplary deposition sequence for forming multilayer film stacks according to some embodiments of the present invention.

FIG. 8 illustrates an exemplary deposition sequence for forming multilayer film stacks according to some embodiments of the present invention. A sequence for forming a simple multilayer film stack comprising a substrate, a dielectric material, and an electrode material to form a simple capacitor stack will be used as an example. Those skilled in the art will understand that the substrate may already have several layers comprising conductive layers, dielectric layers, or both deposited thereon. Step A begins with the substrate, wherein the substrate (or a previous material deposited thereon) is operable as a first electrode of the capacitor stack. In step B, a first material is formed above the substrate wherein the first material is operable as a dielectric of the capacitor stack. As illustrated in FIG. 8, step B, the first material is uniformly formed across the substrate surface. This may be accomplished using a conventional deposition chamber or may be accomplished using a combinatorial deposition chamber. If a combinatorial deposition chamber is used, then each of the large area showerhead sections, (i.e. as described previously), would be used to deposit the same material using the same process parameters. This results in a uniform formation of the first material. In step C, multiple alternatives of a second material are formed above the first material wherein the second material is operable as the second electrode of the capacitor stack. As illustrated in FIG. 8, step C, the second material is deposited in small spots using a plurality of the small spot showerhead apparatus described previously. Advantageously, the plurality of small spot showerhead apparatus are integrated into large area, quadrant showerheads as described previously. FIG. 8, step C, illustrates twelve electrode experiments. They may represent the combinatorial variation of precursor chemicals, reactant chemicals, precursor/reactant delivery conditions (i.e. flow rates, pressure, pulse times, etc.), electrode thickness, substrate temperature, etc. Each of the twelve capacitors would then be tested to determine the optimum material and/or processing conditions. Typical tests may comprise measuring capacitance as a function of applied voltage (i.e. C-V curve), measuring current as a function of applied voltage (i.e. I-V curve), measuring the k value of the dielectric material, measure the equivalent oxide thickness (EOT) of the dielectric material, measuring the concentration and energy levels of traps or interface states, measuring the concentration and mobility of charge carriers, etc.

Figure 9:
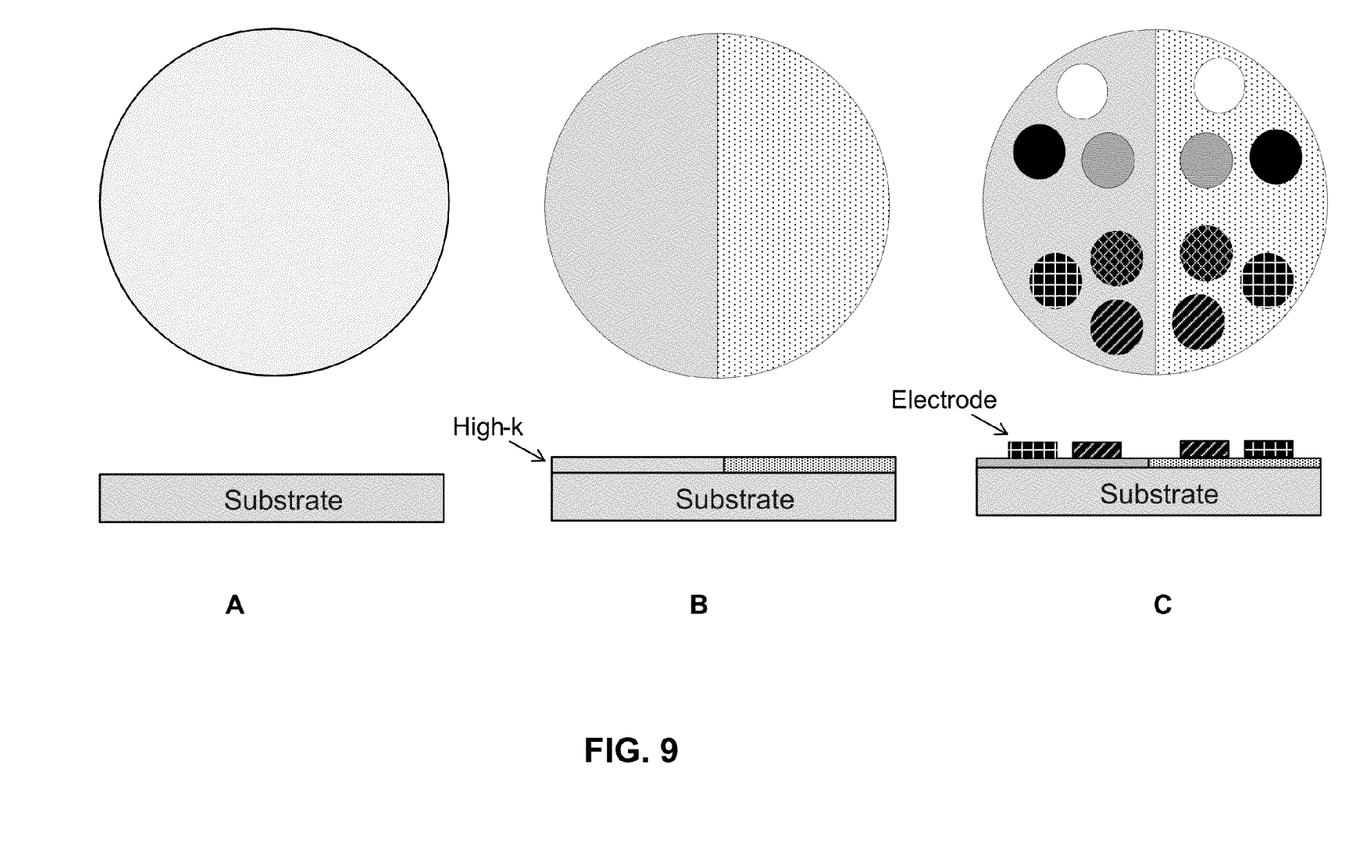
FIG. 9 illustrates an exemplary deposition sequence for forming multilayer film stacks according to some embodiments of the present invention.

FIG. 9 illustrates an exemplary deposition sequence for forming multilayer film stacks according to some embodiments of the present invention. A sequence for forming a simple multilayer film stack comprising a substrate, a dielectric material, and an electrode material to form a simple capacitor stack will be used as an example. Those skilled in the art will understand that the substrate may already have several layers comprising conductive layers, dielectric layers, or both deposited thereon. Step A begins with the substrate, wherein the substrate (or a previous material deposited thereon) is operable as a first electrode of the capacitor stack. In step B, two alternatives of a first material are formed above the substrate wherein the first material is operable as a dielectric of the capacitor stack. As illustrated in FIG. 9, step B, the two alternatives are formed in each of two sections across the substrate surface respectively. This may be accomplished using a combinatorial deposition chamber. In the combinatorial deposition chamber, two of the large area showerhead sections, (i.e. as described previously), would be used to deposit the first alternative on one half of the substrate using the same process parameters, and the other two of the large area showerhead sections, (i.e. as described previously), would be used to deposit the second alternative on the other half of the substrate using the same process parameters. In step C, multiple alternatives of a second material are formed above the first material wherein the second material is operable as the second electrode of the capacitor stack. As illustrated in FIG. 9, step C, the second material is deposited in small spots using a plurality of the small spot showerhead apparatus described previously. Advantageously, the plurality of small spot showerhead apparatus are integrated into large area, quadrant showerheads as described previously. FIG. 9, step C, illustrates twelve capacitor experiments, two dielectric materials and six electrode materials. They may represent the combinatorial variation of precursor chemicals, reactant chemicals, precursor/reactant delivery conditions (i.e. flow rates, pressure, pulse times, etc.), electrode thickness, substrate temperature, etc. Each of the twelve capacitors would then be tested to determine the optimum material and/or processing conditions. Typical tests may comprise measuring capacitance as a function of applied voltage (i.e. C-V curve), measuring current as a function of applied voltage (i.e. I-V curve), measuring the k value of the dielectric material, measure the equivalent oxide thickness (EOT) of the dielectric material, measuring the concentration and energy levels of traps or interface states, measuring the concentration and mobility of charge carriers, etc.

Figure 10:
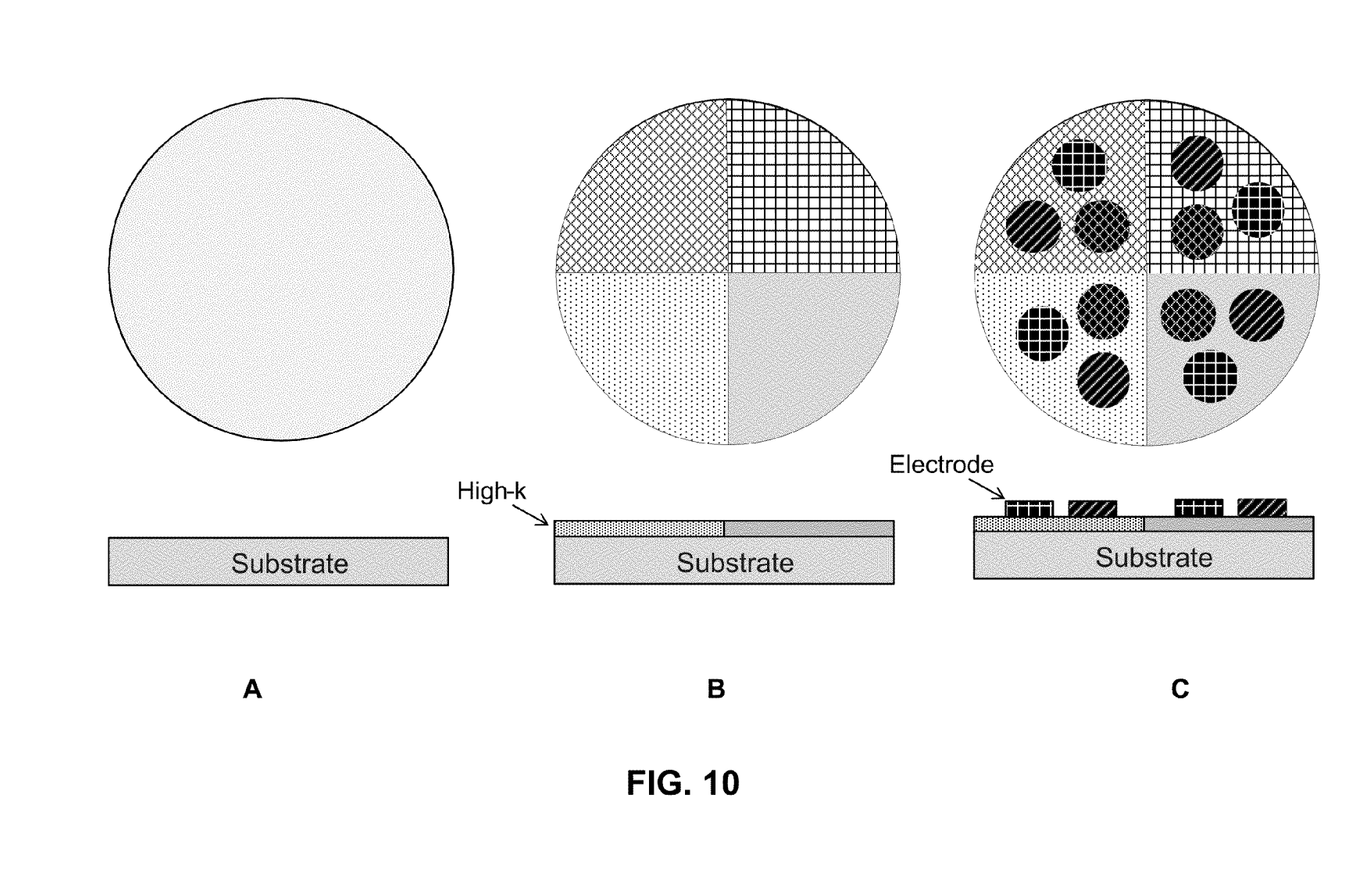
FIG. 10 illustrates an exemplary deposition sequence for forming multilayer film stacks according to some embodiments of the present invention.

FIG. 10 illustrates an exemplary deposition sequence for forming multilayer film stacks according to some embodiments of the present invention. A sequence for forming a simple multilayer film stack comprising a substrate, a dielectric material, and an electrode material to form a simple capacitor stack will be used as an example. Those skilled in the art will understand that the substrate may already have several layers comprising conductive layers, dielectric layers, or both deposited thereon. Step A begins with the substrate, wherein the substrate (or a previous material deposited thereon) is operable as a first electrode of the capacitor stack. In step B, four alternatives of a first material are formed above the substrate wherein the first material is operable as a dielectric of the capacitor stack. As illustrated in FIG. 10, step B, the four alternatives are formed in each of four sections across the substrate surface respectively. This may be accomplished using a combinatorial deposition chamber. In the combinatorial deposition chamber, each of the large area showerhead sections, (i.e. as described previously), would be used to deposit one of the four alternatives on the substrate. In step C, multiple alternatives of a second material are formed above the first material wherein the second material is operable as the second electrode of the capacitor stack. As illustrated in FIG. 10, step C, the second material is deposited in small spots using a plurality of the small spot showerhead apparatus described previously. Advantageously, the plurality of small spot showerhead apparatus are integrated into large area, quadrant showerheads as described previously. FIG. 10, step C, illustrates twelve capacitor experiments, four dielectric materials and three electrode materials. They may represent the combinatorial variation of precursor chemicals, reactant chemicals, precursor/reactant delivery conditions (i.e. flow rates, pressure, pulse times, etc.), electrode thickness, substrate temperature, etc. Each of the twelve capacitors would then be tested to determine the optimum material and/or processing conditions. Typical tests may comprise measuring capacitance as a function of applied voltage (i.e. C-V curve), measuring current as a function of applied voltage (i.e. I-V curve), measuring the k value of the dielectric material, measure the equivalent oxide thickness (EOT) of the dielectric material, measuring the concentration and energy levels of traps or interface states, measuring the concentration and mobility of charge carriers, etc.

FIGS. 8-10 used a simple capacitor stack to illustrate various deposition sequences for forming multilayer film stacks. These methods may be applied to specific devices that are of technological importance.

In a first example, the methods described above can be applied to the development of dynamic random access memory (DRAM) capacitor stacks. In their simplest configuration, DRAM metal-insulator-metal (MIM) capacitor stacks comprise a bottom electrode (BEC) material, a dielectric material, and a top electrode (TEC) material. Table 1 below illustrates two possible deposition sequences utilizing a mixture of large area and small spot showerhead apparatus as described previously. In the table, "large" will refer to a step wherein one of the large area showerhead configurations are used, "small" will refer to a step wherein one of the small spot showerhead configurations are used. In each case, the deposition sequence will be BEC deposition followed by dielectric layer deposition followed by TEC deposition. As illustrated in FIGS. 8-10, the steps using a small configuration will allow multiple materials or processes to be evaluated within each quadrant.

TABLE 1

|  | Experiment 1 | Experiment 2 |
| --- | --- | --- |
| BEC | Large | Large |
| Dielectric | Large | Small |
| TEC | Small | Small |

In a second example, the methods described above can be applied to the development of resistive random access memory (ReRAM) capacitor stacks. In their simplest configuration, ReRAM capacitor stacks comprise a bottom electrode (BEC) material, a switching dielectric material, a coupling dielectric material, and a top electrode (TEC) material.

Table 2 below illustrates three possible deposition sequences utilizing a mixture of large area and small spot showerhead apparatus as described previously. In the table, "large" will refer to a step wherein one of the large area showerhead configurations are used, "small" will refer to a step wherein one of the small spot showerhead configurations are used. In each case, the deposition sequence will be BEC deposition followed by switching dielectric layer deposition followed by coupling dielectric layer deposition followed by TEC deposition. As illustrated in FIGS. 8-10, the steps using a small configuration will allow multiple materials or processes to be evaluated within each quadrant.

TABLE 2

|  | Experiment 1 | Experiment 2 | Experiment 3 |
| --- | --- | --- | --- |
| BEC | Large | Large | Large |
| Switching | Large | Large | Small |
| Coupling | Large | Small | Small |
| TEC | Small | Small | Small |

In a third example, the methods described above can be applied to the development of high-k metal gate (HKMG) stacks. In their simplest configuration, HKMG stacks comprise a high-k dielectric layer, a dielectric capping layer, a high work function material, a barrier material, and an electrode fill material. Table 3 below illustrates four possible deposition sequences utilizing a mixture of large area and small spot showerhead apparatus as described previously. In the table, "large" will refer to a step wherein one of the large area showerhead configurations are used, "small" will refer to a step wherein one of the small spot showerhead configurations are used. In each case, the deposition sequence will be high-k dielectric deposition followed by dielectric capping layer deposition followed by high work function material deposition followed by barrier material deposition followed by electrode fill material deposition. As illustrated in FIGS. 8-10, the steps using a small configuration will allow multiple materials or processes to be evaluated within each quadrant.

TABLE 3

|  | Experiment 1 | Experiment 2 | Experiment 3 | Experiment 4 |
| --- | --- | --- | --- | --- |
| High-K | Large | Large | Large | Large |
| Dielectric Cap | Large | Large | Large | Small |
| High WF | Large | Large | Small | Small |
| Barrier | Large | Small | Small | Small |
| Electrode Fill | Small | Small | Small | Small |

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a film stack comprising:
   defining one or more first isolated regions on a substrate
   forming a first material on the first isolated regions using a large area combinatorial showerhead;
   forming a second material above the first material in each of the first isolated regions;
   defining one or more second isolated regions within each of the first isolated regions; and
   forming a third material above the second material on each of the second isolated regions, using a small spot combinatorial showerhead, wherein the area of the third material is less than the area of the first material thereby facilitating combinatorial testing.

2. The method of claim 1 wherein a composition of the first material is varied between at least two of the first isolated regions.

3. The method of claim 1 wherein a set of process parameters of the first material is varied between at least two of the first isolated regions.

4. The method of claim 1 wherein the first material is a conductive material operable as an electrode of a device.

5. The method of claim 1 wherein the second material is formed using a large area combinatorial showerhead.

6. The method of claim 1 wherein a composition of the second material is varied between at least two of the first isolated regions.

7. The method of claim 1 wherein a set of process parameters of the second material is varied between at least two of the first isolated regions.

8. The method of claim 1 wherein the second material is a dielectric material operable as a dielectric of a device.

9. The method of claim 1 wherein a composition of the third material is varied between at least two of the second isolated regions within each of the first isolated regions.

10. The method of claim 1 wherein a set of process parameters of the third material is varied between at least two of the second isolated regions within each of the first isolated regions.

11. The method of claim 1 wherein the third material is a conductive material operable as an electrode of a device.

12. The method of claim 1 further comprising:
    defining one or more third isolated regions within each of the first isolated regions; and
    forming the second material above the first material in each of the third isolated regions.

13. The method of claim 12 wherein the second material is formed using a small spot combinatorial showerhead.

14. The method of claim 12 wherein a composition of the second material is varied between at least two of the third isolated regions.

15. The method of claim 12 wherein a set of process parameters of the second material is varied between at least two of the third isolated regions.

16. The method of claim 12 wherein the second material is a dielectric material operable as a dielectric of a device.

17. The method of claim 1 wherein the second material is formed using a small spot combinatorial showerhead.

18. A method for forming a film stack comprising:
    defining one or more first isolated regions on a substrate,
    forming a first material on the first isolated regions using a large area combinatorial showerhead,
    forming a plurality of second material layers above the first material in each of the first isolated regions using either a large area combinatorial showerhead or a small spot combinatorial showerhead, provided that the first use of a small spot combinatorial showerhead is followed entirely by the use of small spot combinatorial showerheads,
    forming a final layer of the film stack using small spot combinatorial showerheads, wherein the area of the final layer is less than the area of the first layer thereby facilitating combinatorial testing.

* * * * *